(12) United States Patent
Song et al.

(10) Patent No.: US 9,972,525 B2
(45) Date of Patent: May 15, 2018

(54) METHOD FOR PREPARING TRENCH ISOLATION STRUCTURE

(71) Applicant: CSMC TECHNOLOGIES FAB2 CO., LTD., Wuxi New District (CN)

(72) Inventors: Hua Song, Wuxi New District (CN); Jiao Wang, Wuxi New District (CN); Huan Yang, Wuxi New District (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days. days.

(21) Appl. No.: 15/547,200

(22) PCT Filed: Sep. 24, 2015

(86) PCT No.: PCT/CN2015/090507
§ 371 (c)(1),
(2) Date: Jul. 28, 2017

(87) PCT Pub. No.: WO2016/119480
PCT Pub. Date: Aug. 4, 2016

(65) Prior Publication Data
US 2018/0033677 A1    Feb. 1, 2018

(30) Foreign Application Priority Data
Jan. 29, 2015 (CN) .......................... 2015 1 0047580

(51) Int. Cl.
*H01L 21/76* (2006.01)
*H01L 21/762* (2006.01)
(Continued)

(52) U.S. Cl.
CPC ...... *H01L 21/76202* (2013.01); *H01L 21/763* (2013.01); *H01L 21/76205* (2013.01);
(Continued)

(58) Field of Classification Search
None
See application file for complete search history.

(56) References Cited

U.S. PATENT DOCUMENTS

| 5,960,299 A | * | 9/1999 | Yew | ................. H01L 21/76229 148/DIG. 50 |
| 6,174,785 B1 | * | 1/2001 | Parekh | ............. H01L 21/76232 148/DIG. 50 |
| 2003/0156513 A1 | | 8/2003 | Tseng et al. | |

FOREIGN PATENT DOCUMENTS

| CN | 101414573 A | 4/2009 |
| CN | 102800583 A | 11/2012 |
| CN | 102931125 A | 2/2013 |

OTHER PUBLICATIONS

International Search Report dated Dec. 23, 2015 issued in International Application No. PCT/CN2015/090507.

* cited by examiner

*Primary Examiner* — Jack Chen
(74) *Attorney, Agent, or Firm* — Polsinelli PC

(57) ABSTRACT

A method for preparing a trench isolation structure, which comprises the following steps of: providing a substrate; forming an oxide layer on the substrate; successively generating an oxidation barrier layer and an ethyl orthosilicate layer on the surface of the oxide layer; etching the oxidation barrier layer and the ethyl orthosilicate layer; corroding the substrate to form a trench by using the oxidation barrier layer and the ethyl orthosilicate layer as mask layers; removing the ethyl orthosilicate layer, and oxidizing a side wall of the trench by using the oxidation barrier layer as a barrier layer; filling the trench with a polysilicon and then etching back the polysilicon, and removing the polysilicon (Continued)

on the surface of the oxidation barrier layer; and removing the oxidation barrier layer and the oxide layer on the surface of the substrate.

10 Claims, 7 Drawing Sheets

(51) Int. Cl.
*H01L 21/8234* (2006.01)
*H01L 21/763* (2006.01)
(52) U.S. Cl.
CPC .. *H01L 21/76224* (2013.01); *H01L 21/76227* (2013.01); *H01L 21/76264* (2013.01); *H01L 21/76286* (2013.01); *H01L 21/823481* (2013.01)

METHOD FOR PREPARING TRENCH ISOLATION STRUCTURE

CROSS REFERENCE TO RELATED APPLICATIONS

This application is a National Phase filing under 35 U.S.C. § 371 of PCT/CN2015/090507 filed on Sep. 24, 2015, and this application claims priority to Application No. CN 201510047580.4 filed on Jan. 29, 2015, under 35 U.S.C. § 119. The entire contents of each application are hereby incorporated by reference.

FIELD OF THE INVENTION

The present disclosure relates to the technical field of semiconductor manufacturing, and particularly relates to a method of manufacturing a trench isolation structure.

BACKGROUND OF THE INVENTION

In the conventional manufacturing process (e.g., Silicon-On-Insulator, SOI), the manufacturing of the trench isolation structure typically chooses a tetraethyl orthosilicate (TEOS) layer as the etching hardmask. When such a method is employed to manufacture the trench isolation structure, the wet-etching is at a relatively large scale, a relatively large groove will be formed in the top of the trench, the flatness is unfavorable and the structure is vulnerable to the polysilicon residue problem causing a soft connection which affects the performance of the product. In addition, the trench isolation structure obtained by such a method is of a relatively large critical dimension.

SUMMARY OF THE INVENTION

Accordingly, it is necessary to provide a method of manufacturing a trench isolation structure, the trench isolation structure manufactured accordingly has a better flatness on a top thereof and a relatively small critical dimension.

A method of manufacturing a trench isolation structure includes:

providing a substrate; forming an oxidation layer on the substrate;

generating an oxidation barrier layer and an ethyl orthosilicate layer successively on a surface of the oxidation layer;

etching the oxidation barrier layer and the ethyl orthosilicate layer;

etching the substrate to form a trench using the etched oxidation barrier layer and the ethyl orthosilicate layer as masking layers;

removing the ethyl orthosilicate layer, and oxidizing a sidewall of the trench using the oxidation barrier layer as a barrier layer;

filling polysilicon in the trench, and then performing an etchback process to the polysilicon to remove the polysilicon on the surface of the oxidation barrier layer; and removing the oxidation barrier layer and the oxidation layer on the surface of the substrate.

The foregoing method of manufacturing a trench isolation structure, the non-trench region can be masked by the oxidation barrier layer in the oxidation of the trench, thereby obstructing the oxidation to the non-trench region. As such, there is no need to remove the oxidation layer of the non-trench region by lots of wet-etching, the wet-etching volume is reduced whilst the lateral etching resulted from the wet-etching is avoided, such that the trench isolation structure is of a relatively small critical dimension. Additionally, a relatively large groove on the top of the trench isolation structure resulted from lots of wet-etching can be avoided, such that the top of the trench isolation structure is provided with a favorable flatness.

BRIEF DESCRIPTION OF THE DRAWINGS

The technical solutions of the present invention will be clearly and completely described in the following with reference to the accompanying drawings. It is obvious that the embodiments to be described are only a part rather than all of the embodiments of the present invention. All other embodiments obtained by persons skilled in the art based on the embodiments of the present invention without creative efforts shall fall within the protection scope of the present invention.

DETAILED DESCRIPTION OF THE EMBODIMENTS

Figure 1:
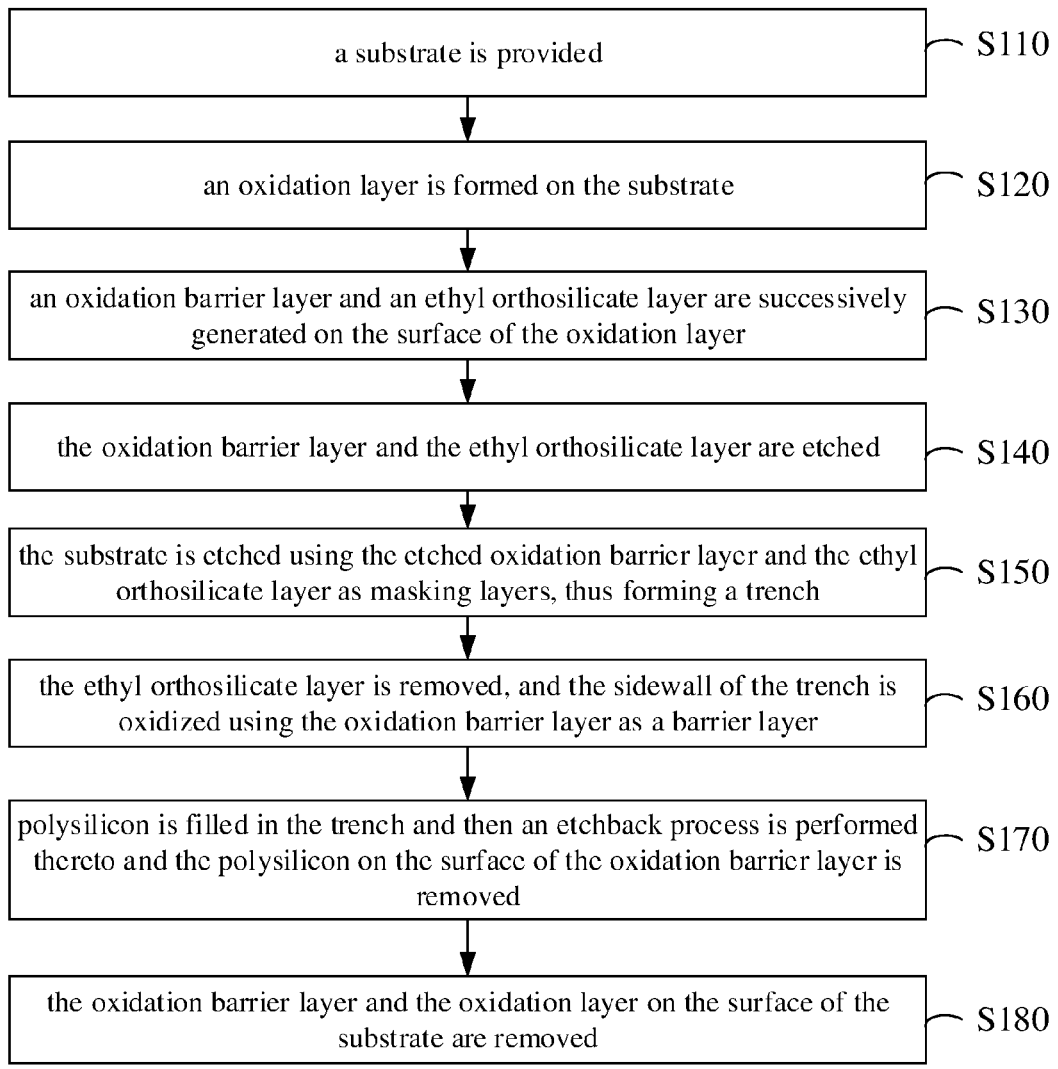
FIG. 1 is a flowchart of a method of manufacturing a trench isolation structure according to an embodiment.

The present invention will be described in the following with reference to the accompanying drawings and the embodiments. Preferable embodiments are presented in the drawings. However, numerous specific details are described hereinafter in order to facilitate a thorough understanding of the present disclosure. The various embodiments of the disclosure may, however, be embodied in many different forms and should not be construed as limited to the specific embodiments set forth hereinafter, and people skilled in the art can make similar modifications without departing from the spirit of the present disclosure.

FIG. 1 is a flowchart of a method of manufacturing a trench isolation structure according to an embodiment, the method can be applied to semiconductor manufacture processes, such as the Silicon-On-Insulator (SOI) process. A method of manufacturing a trench isolation structure includes:

Step S110, a substrate is provided.

In the present embodiment, the trench isolation structure is manufactured on the basis of the SOI process, thus the SOI structure is required to be manufactured after the substrate is provided. That is, after step S110, it is also needed to execute the step of forming a burial oxidation layer and a top silicon successively to form the SOI structure.

Step S120, an oxidation layer is formed on the substrate.

In the present embodiment, as a SOI structure is formed, the step of forming an oxidation layer on the substrate is to form an oxidation layer on the surface of the top silicon. The oxidation layer is mainly used to separate the stress between the top silicon and the oxidation barrier layer, thus a relatively thin layer of oxidation will suffice.

Step S130, an oxidation barrier layer and an ethyl orthosilicate layer are successively generated on the surface of the oxidation layer.

Figure 2:
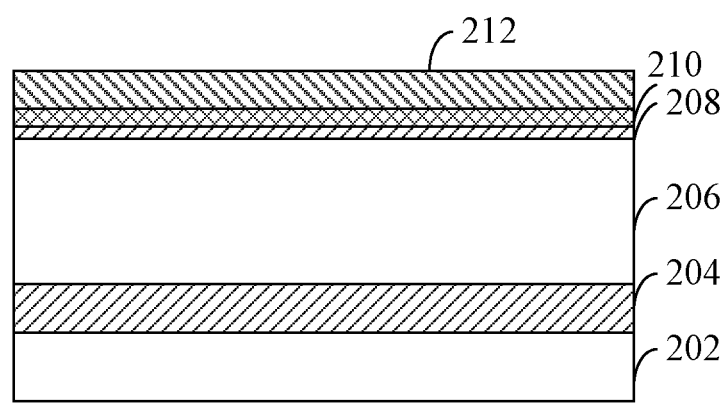
FIG. 2 is a schematic view of a device after step S130 in FIG. 1.

The oxidation barrier layer can be made of substances that can block the thermal oxidation growth, such as silicon nitrides. In the present embodiment, the oxidation barrier layer is a silicon nitride layer. The silicon nitride has an extremely high compactness, thus it is an excellent barrier layer for wet-etching, which can stop exterior electric charges from entering the interior of the device, and thereby serving to protect the device and improving the operation reliability of the device. The ethyl orthosilicate layer is formed by low pressure chemical vapor deposition (LP-CVD). The ethyl orthosilicate layer is a thin $SiO_2$ film generated using tetraethyl orthosilicate (TEOS) as the gas source. FIG. 2 is a schematic view of a device after step S130. A burial oxidation layer 204 and a top silicon 206 are formed on the substrate 202, thereby forming a SOI structure. An oxidation layer 208, an oxidation barrier layer 210 and an ethyl orthosilicate layer 212 are successively formed on the surface of the top silicon 206.

Step S140, the oxidation barrier layer and the ethyl orthosilicate layer are etched.

Figure 3:
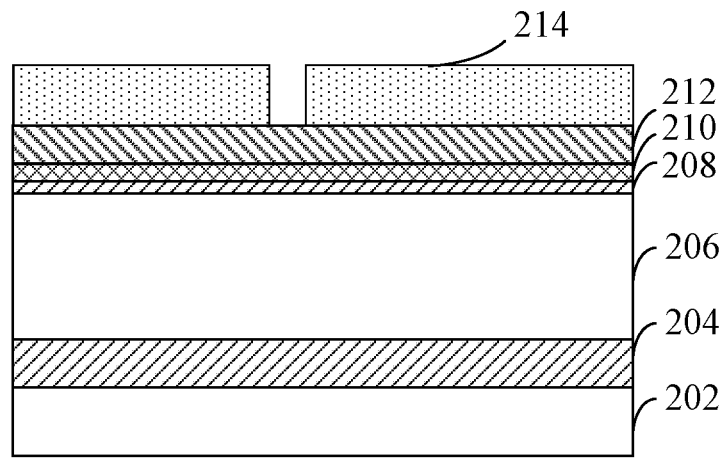
FIG. 3 is a schematic view of the device after a photolithography is performed to a photoresist layer according to the embodiment in FIG. 1.
Figure 4:
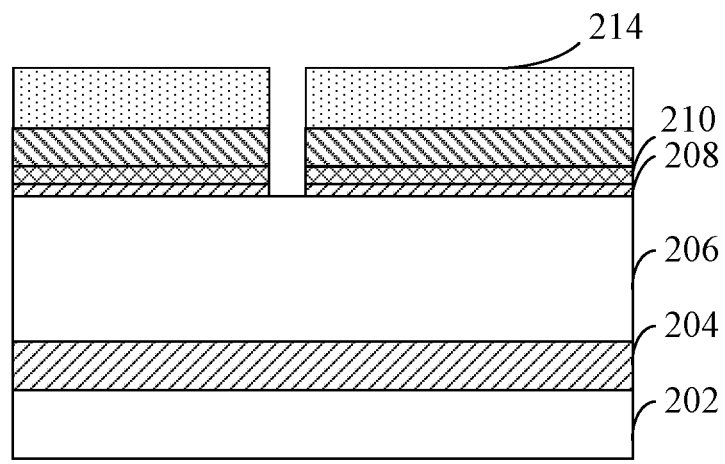
FIG. 4 is a schematic view of the device after step S140 in FIG. 1.
Figure 5:
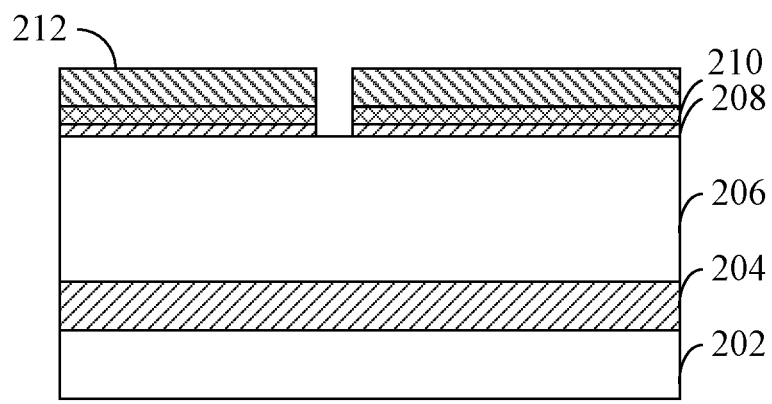
FIG. 5 is a schematic view of the device after the photoresist layer is removed according to the embodiment in FIG. 1.

In the present embodiment, prior to etching the oxidation barrier layer 210 and the ethyl orthosilicate layer 212, a photoresist layer 214 is required to be formed on the surface of the ethyl orthosilicate layer 212, and photolithography is performed to the photoresist layer 214 to form a photolithography window, as shown in FIG. 3. As such, using the photoresist layer 214 as the barrier layer, the oxidation barrier layer 210 and the ethyl orthosilicate layer 212 are etched to form a window area. In the present embodiment, in the etching process, the corresponding position of the oxidation layer 208 is etched, the schematic diagram of the device after being etched is shown in FIG. 4. After the etching, the photoresist layer 214 is removed. FIG. 5 is a schematic view of the device after the photoresist layer is removed.

Step S150, the substrate is etched using the etched oxidation barrier layer and the ethyl orthosilicate layer as masking layers, thus forming a trench.

Figure 6:
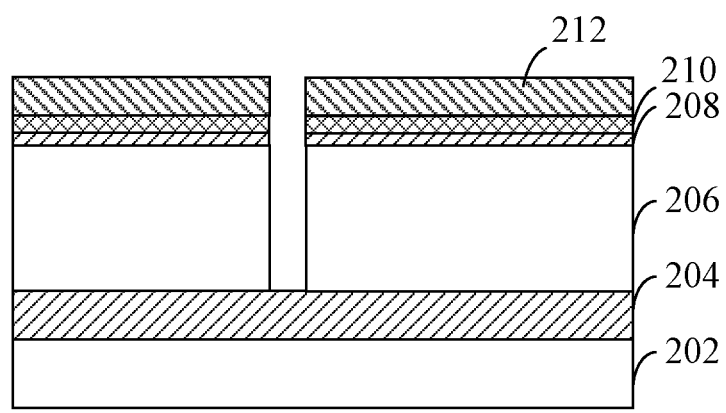
FIG. 6 is a schematic view of the device after step S160 in FIG. 1.

Using the etched oxidation barrier layer 210 and the ethyl orthosilicate layer 212 as masking layers, the top silicon 206 is etched to form a trench. FIG. 6 is a schematic view of a device after step S150.

Step S160, the ethyl orthosilicate layer is removed, and the sidewall of the trench is oxidized using the oxidation barrier layer as a barrier layer.

In the present embodiment, while removing the ethyl orthosilicate layer 212, certain etching is also performed to the burial oxidation layer 204 in the trench, such that the trench region extends to the burial oxidation layer 204 area.

Figure 7:
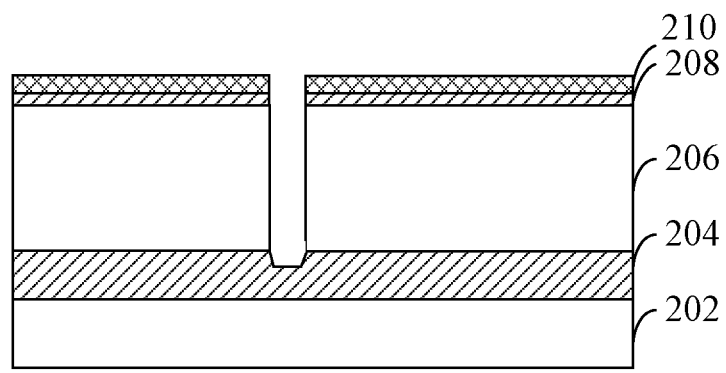
FIG. 7 is a schematic view of the device after the ethyl orthosilicate layer is removed according to the embodiment in FIG. 1.

FIG. 7 is a schematic view of the device after the ethyl orthosilicate layer is removed.

Figure 8:
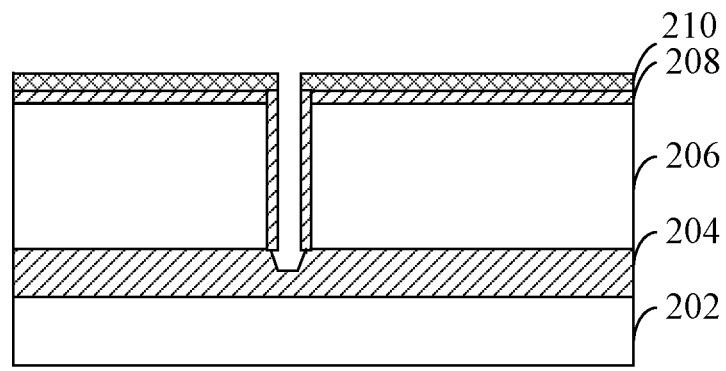
FIG. 8 is a schematic view of the device after step S170 in FIG. 1.

After the ethyl orthosilicate layer is removed, and using the oxidation barrier layer 210 as a barrier layer, the trench is oxidized. In the conventional trench manufacture process, merely the ethyl orthosilicate layer is used as a barrier layer, thus the whole wafer (non-trench region and trench region) is oxidized in the trench oxidation process. A typical oxidation layer is over thousands of angstroms, thus the oxidation layer of the active region must be removed in the subsequent process to define the active region, the required wet-etching load is great and causing the lateral etching to be relatively great, such that the critical dimension of the trench isolation structure is relatively great and a comparatively large groove will be formed at the top of the trench isolation structure, which is unfavorable to achieve the planarization of the surface of the trench isolation structure. In the present embodiment, the oxidation barrier layer 210 can shield the non-trench region, such that an oxidation layer is avoided to be formed in the non-trench region, thereby reducing the wet-etching load in subsequent process and hence avoid the lateral etching resulted from the wet-etching and the etching at the top of the trench isolation structure, which is advantageous to effect the miniaturization of the critical dimension as well as the planarization of the surface of the trench isolation structure. FIG. 8 is a schematic view of the device after trench oxidation.

Step S170, polysilicon is filled in the trench and then an etchback process is performed thereto and the polysilicon on the surface of the oxidation barrier layer is removed.

Figure 9:
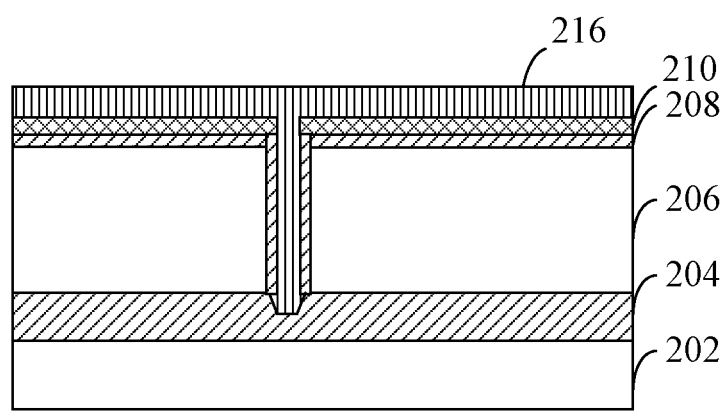
FIG. 9 is a schematic view of the device after filling polysilicon into the trench region according to the embodiment in FIG. 1.
Figure 10:
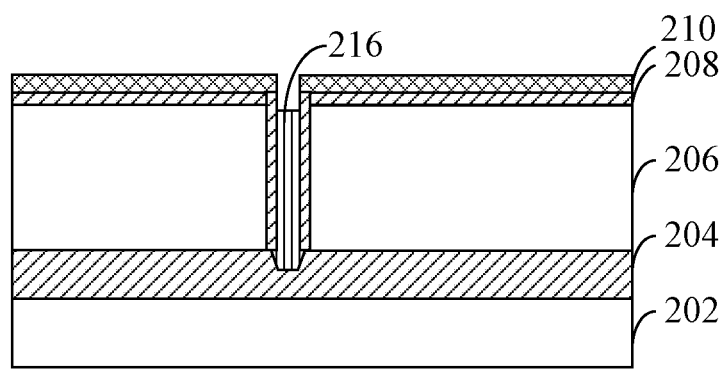
FIG. 10 is a schematic view of the device after an etchback is performed to the polysilicon according to the embodiment in FIG. 1.

FIG. 9 is a schematic view of the device after filling polysilicon 216 into the trench region. After the filling of the polysilicon 216, in order to ensure that the polysilicon in the non-trench region is etched completely, the polysilicon 216 will be etched back, so as to remove the polysilicon on the surface of the oxidation barrier layer 210. The etchback process to the polysilicon 216 is performed in a way to find the finishing point. When the polysilicon 216 is etched to a contacting surface between the oxidation layer 208 and the oxidation barrier layer 210, it can be determined that the etching is completed. On this basis, a little etching time is added to form an over-etching, thus ensuring that the polysilicon 216 is completely etched away, such that the back-etched polysilicon 216 has a surface lower than the contacting surface between the oxidation layer 208 and the oxidation barrier layer 210, and a polysilicon surface with an ideal morphology is obtained. In the present embodiment, as the oxidation layer 208 is relatively thin, the etchback can be finished upon arriving the contacting surface between the oxidation layer 208 and the oxidation barrier layer 210, thereby avoiding a relatively great over-etching at the top of the trench isolation structure which will affect the surface planarization of the trench isolation structure. FIG. 10 is a schematic view of the device after the etchback is performed to the polysilicon 216.

Step S180, the oxidation barrier layer and the oxidation layer on the surface of the substrate are removed.

Figure 11:
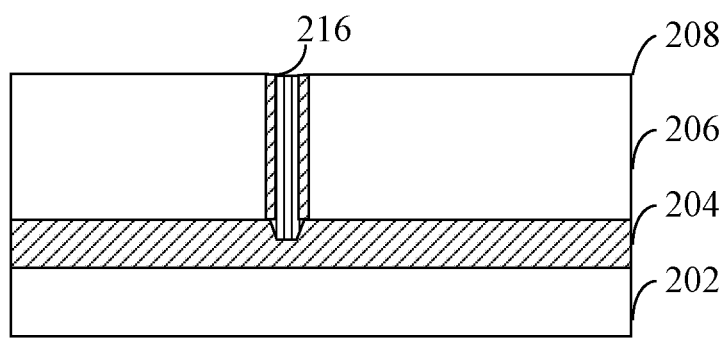
FIG. 11 is a schematic view of the device after step S180 in FIG. 1.

A SOI structure is formed in the present embodiment, therefore after the oxidation barrier layer and the oxidation layer on the surface of the top silicon are removed in present step, the manufacture of the trench isolation structure is completed. In the present embodiment, the oxidation barrier layer is removed by the chemical-mechanical polishing process, while the oxidation layer is removed by the wet-etching process. It should be understood that, in step 180, the oxidation barrier layer and the oxidation layer on the surface of the substrate can be removed by other processes common in the art. FIG. 11 is a schematic view of a device after step S180.

According to the aforementioned method of manufacturing a trench isolation structure, the non-trench region can be shielded by the oxidation barrier layer during the process of oxidation of the trench, thereby preventing the non-trench region from being oxidized. As such, there is no need to remove the oxidation layer of the non-trench region by a large number of wet-etching, the wet-etching volume is reduced while the lateral etching resulted from the wet-etching is avoided, such that the trench isolation structure has a relatively small critical dimension. Additionally, a relatively large groove on the top of the trench isolation structure resulted from lots of wet-etching can be avoided, such that the top of the trench isolation structure is provided with a favorable flatness.

The different technical features of the foregoing embodiments can have various combinations which are not described for the purpose of brevity. Nevertheless, to the extent the combining of the different technical features do not conflict with each other, all such combinations must be regarded as within the scope of the disclosure.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall within the protection scope of the present disclosure. Therefore, the protection scope of the present disclosure shall be subject to the protection scope of the claims.

What is claimed is:

1. A method of manufacturing a trench isolation structure, comprising the following steps of:
    providing a substrate;
    forming an oxidation layer on the substrate;
    generating an oxidation barrier layer and an ethyl orthosilicate layer successively on a surface of the oxidation layer;
    etching the oxidation barrier layer and the ethyl orthosilicate layer;
    etching the substrate to form a trench using the etched oxidation barrier layer and the ethyl orthosilicate layer as masking layers;
    removing the ethyl orthosilicate layer, and oxidizing a sidewall of the trench using the oxidation barrier layer as a barrier layer;
    filling polysilicon in the trench and then performing an etchback process to the polysilicon to remove the polysilicon on a surface of the oxidation barrier layer; and
    removing the oxidation barrier layer and the oxidation layer on the surface of the substrate.

2. The method of claim 1, wherein the oxidation barrier layer is a silicon nitride layer.

3. The method of claim 1, wherein after the step of generating the oxidation barrier layer and the ethyl orthosilicate layer successively on the surface of the oxidation layer, the method further comprises the step of forming a photoresist layer on the surface of the ethyl orthosilicate layer and performing photolithography;
    wherein the step of etching the oxidation barrier layer and the ethyl orthosilicate layer is to use the photoresist as a mask layer to etch the oxidation barrier layer and the ethyl orthosilicate layer;
    wherein after the step of etching the oxidation barrier layer and the ethyl orthosilicate layer, the method further comprises the step of removing the photoresist layer.

4. The method of claim 1, wherein the step of etching the oxidation barrier layer and the ethyl orthosilicate layer further comprises etching the oxidation layer.

5. The method of claim 1, wherein in the step of filling polysilicon in the trench and then performing an etchback process to the polysilicon to remove the polysilicon on the surface of the oxidation barrier layer, a surface of the polysilicon after the etch back process is lower than a contacting surface between the oxidation layer and the oxidation barrier layer.

6. The method of claim 1, wherein in the step of generating the oxidation barrier layer and the ethyl orthosilicate layer successively on the surface of the oxidation layer, the ethyl orthosilicate is formed by low pressure chemical vapor deposition.

7. The method of claim 1, wherein after the step of providing the substrate and prior to the step of forming the oxidation layer on the substrate, the method further comprises the step of forming a burial oxidation layer and a top silicon successively on the substrate to forming a Silicon-On-Insulator (SOI) structure.

8. The method of claim 7, wherein the step of forming an oxidation layer on the substrate is to form the oxidation layer on the top silicon;
    wherein the step of etching the substrate to form the trench using the etched oxidation barrier layer and the ethyl orthosilicate layer as masking layers is to etch the top silicon to form the trench using the etched oxidation barrier layer and the ethyl orthosilicate layer as masking layers.

9. The method of claim 1, wherein in the step of removing the oxidation barrier layer and the oxidation layer on the surface of the substrate, the removing of the oxidation barrier layer is completed by a chemical mechanical polishing process.

10. The method of claim 9, wherein the removing of the oxidation barrier layer is completed by a wet-etching process.

* * * * *